United States Patent [19]
Freyman et al.

[11] Patent Number: 5,852,870
[45] Date of Patent: Dec. 29, 1998

[54] METHOD OF MAKING GRID ARRAY ASSEMBLY

[75] Inventors: Bruce J. Freyman, Tempe; John Briar, Phoenix; Jack C. Maxcy, Chandler, all of Ariz.

[73] Assignee: Amkor Technology, Inc., Del.

[21] Appl. No.: 637,877

[22] Filed: Apr. 24, 1996

[51] Int. Cl.⁶ .................................................. H05K 3/30
[52] U.S. Cl. ................................ 29/841; 29/840; 29/827
[58] Field of Search ............................ 29/830, 827, 855, 29/841

[56] References Cited

U.S. PATENT DOCUMENTS

| | | |
|---|---|---|
| 5,045,921 | 9/1991 | Lin et al. . |
| 5,170,328 | 12/1992 | Kruppa ..................................... 361/398 |
| 5,355,283 | 10/1994 | Marrs et al. ............................ 29/841 X |
| 5,474,957 | 12/1995 | Urushima .................................. 29/827 |
| 5,490,324 | 2/1996 | Newman . |
| 5,534,467 | 7/1996 | Rostoker ................................... 29/827 |
| 5,620,928 | 4/1997 | Lee et al. .............................. 29/855 X |
| 5,654,243 | 8/1997 | Yoneda et al. ......................... 29/841 X |
| 5,661,086 | 8/1997 | Nakashima et al. ................... 29/827 X |
| 5,674,785 | 10/1997 | Akram et al. . |

FOREIGN PATENT DOCUMENTS

| | | |
|---|---|---|
| 0 408 101 A2 | 1/1991 | European Pat. Off. .................... 21/60 |
| 0 657 921 | 6/1995 | European Pat. Off. .................... 21/56 |
| 0 664 562 A | 7/1995 | European Pat. Off. .................... 21/56 |
| 296 21 837 | 2/1997 | Germany . |
| 08 107127 | 4/1996 | Japan . |
| 89 10005 A | 10/1989 | WIPO ........................................ 23/50 |

OTHER PUBLICATIONS

Scheuller R.D.: "Design Considerations for a Reliable Low Cost Tape Ball Grid Array Package", International Journal of Microcircuits and Electronic Packaging, vol. 19, No. 2, Apr. 1996, pp. 146–154, XP000639477.

Karnezos, M., et al., "Flex Tape Ball Grid Array", 1996 Proceedings of 46th Electronic Components and Technology Conf., May 28–31, 1996 IEEE, pp. 1271–1277, XP000684990.

Hattas, D., et al., "Mounting Technology of GBA–P and GBA–T", 17th IEEE/CPMT Int'l Electronics Manufacturing Technology Symposium, Austin, Oct. 2–4, 1995. IEEE, pp. 417–421, XP000580510.

Schueller, R.D.: "Design Considerations for a Reliable Low Cost Tape Ball Grid Array Package", Proceedings of IEPS Conference, San Diego, CA, Sep. 1995, pp. 1–14.

Primary Examiner—Carl J. Arbes
Attorney, Agent, or Firm—Skjerven Morrill MacPherson Franklin and Friel LLP; Thomas S. MacDonald

[57] ABSTRACT

A grid array assembly method uses a semi-flexible substrate printed circuit board and includes steps of providing a series of conforming boards each board including bonding pads and metallization on a first surface and conductive vias in the board extending to a second opposite surface containing a contact pad array, testing the boards and determining acceptable boards. A carrier strip with longitudinally aligned apertures mounts individual accepted boards. The strip with mounted boards is passed to a station where an IC die is mounted on the board first surface, wire bonds are placed from the die to the bonding pads and the assembly encapsulated by automolding against a board first surface portion using the strip as the mold gate to form a package body. Subsequently interconnecting balls or bumps are placed on the contact pads and the assembly is removed from the strip.

12 Claims, 4 Drawing Sheets

METHOD OF MAKING GRID ARRAY ASSEMBLY

RELATED APPLICATION

This application relates to commonly assigned U.S. patent application Ser. No. 08/214,339 filed Mar. 16, 1994 in the name of Bruce J. Freyman et al. and the commonly assigned and concurrently filed U.S. patent application Ser. No. 08/637,578 filed Apr. 24, 1996 in the name of Bruce J. Freyman and Robert F. Darveaux, the disclosure of which concurrently filed application is incorporated herein by reference.

BACKGROUND OF THE INVENTION

1. Field of the Invention

This invention relates to packaged grid array assemblies including integrated circuit chips or dies and a method of making such assemblies. More particularly, the invention relates to a method and resultant article which utilizes standard packaging equipment and maximizes the yield of manufactured product at a low cost.

2. Related Art

As integrated circuits have become more complex, a need has arisen for a packaged integrated circuit having a large number of high density, reliable external package connections. It is also desirable to include in a packaged integrated circuit one or more conductive layers for signal routing and provision for ground and power metallization traces. To meet these needs, the ball grid array has been developed as illustrated in FIG. 1 of the related application Ser. No. 08/214,339.

A typical ball grid array includes a semiconductor die, sometimes called herein an integrated circuit (IC) or chip, attached to a die attach surface on a printed circuit-board (PCB) with adhesive. Electrically conductive bond pads on the die are connected by electrically conductive bond wires to electrically conductive traces and/or electrically conductive regions formed on or adjacent to the die attach surface of the substrate. Electrically conductive vias are formed through the substrate from the traces and/or regions on the die attach surface to a mounting surface of the substrate opposite the die attach surface. The electrically conductive traces formed on the mounting surface extend to solder pads formed on the mounting surface. Solder bumps are formed on each of the solder pads. The solder bumps are reflowed to attach the substrate to a larger mother board. An encapsulant such as plastic is formed to enclose the semiconductor die, the bond wires and a portion of the die attach surface of the substrate including most of the traces and/or regions. The vias are shown outside the encapsulant but can be inside the encapsulant. The encapsulant is frequently formed by injection or transfer molding or by conventional molding equipment to form the encapsulant over the die in a ball grid array. Liquid (glob top) encapsulant also can be used.

Recent related art is seen in the illustration of a wire bond TBGA (Tape Ball Grid Array) 1-Metal Microflex Circuit published by the Electronic Product Division of 3M where an IC chip is adhered to a stiffener/heatsink with a polyimide tape first surface containing metallization, wire bonded to the chip and providing conductive vias, outside of a central encapsulant over the chip and bond wires, to solder balls on an opposite surface of the tape.

Currently, molded plastic BGAs are assembled using a printed circuit board (PCB) strip containing multiple BGA (ball grid array) circuits that is rectangular in shape. A single unit BGA image is step and repeated on the PCB strip in order to maximize productivity during assembly. In this way, several BGAs are processed at the same time in many of the assembly processes. The PCB strip format also helps to reduce material handling expense in other areas of the assembly process that operate on only site at a time.

One of the problems with procuring PCBs in strip form that have step and repeated BGA images is that the PCB vendor needs to provide 100% good units on the PCB strip so that the assembly facility does not process "bad" units. If the vendor or in-house manufacturing operation fabricates BGAs in strip form and includes a bad BGA image, all of the remaining good BGA images on the strip have to be thrown away. If the BGA assembly facility accepts bad BGA images on each strip, then the throughput of certain assembly processes is reduced because "bad" units are being processed. Also, the cost of the PCBs increases if the vendor cannot ship PCB strips that contain bad units.

An obvious method of using only "good" units in the BGA assembly process is to have the PCB vendor supply all good PCBs in single unit format instead of in a strip format. The problem with processing singles in the BGA assembly process is that almost all of the off the shelf assembly equipment used by industry today is configured to run PCBs in the strip format. The other drawback of processing single unit PCBs is that the resultant throughput of many of the assembly processes is reduced as compared to throughput in PCB strip processing.

In the manufacture of related art devices by molding operations, it is well recognized that during encapsulation and subsequent removal of a molding die section, that the package encapsulant not only encloses the die and die bonds but also extends along the surface of the die-mounting substrate where a mold runner is located leading to a molten encapsulant supply pot. The excess encapsulant sometimes called "flash" or "bleed", i.e., encapsulant other than that necessary to enclose the die and die bonds, must then be removed. However, when the excess encapsulant is peeled away from the substrate surface, the encapsulant adheres to the substrate surface, twisting the substrate and tearing or rupturing the substrate surface, thereby causing damage to the packaged device. This damage can be cosmetic (e.g. marring of the substrate surface) and/or functional (e.g. fracturing of the substrate; destruction of the electrically conductive traces on the substrate surface; tearing away of the solder mask on the substrate surface to undesirably expose, for instance, copper, and/or weakening or breaking of the seal between the encapsulant and the substrate surface).

Further, in production, it is desirable to integrally form a plurality of substrates in a strip having alignment holes that are located so as to be captured by tooling pins of a fixture, allowing the packaging process (including encapsulation) to be automated. The excess encapsulant must be removed from the strip prior to further processing since, if left attached to the strip, the excess encapsulant extends past the edge of the strip prohibiting automated handling in subsequent processes. Adherence of the excess encapsulant to the substrate during removal of the excess encapsulant may cause torquing of the strip that distorts the strip and renders the strip unusable for further processing. In the first related application, a novel degating region with noble metal plating is formed at each runner or gate location such that the molding compound (encapsulant) bonds weakly with the plated runner area on the PCB substrate allowing removal of excess encapsulant without damaging the remainder of the package assembly.

SUMMARY OF THE INVENTION

According to the present invention, the problem of processing "bad" PCB units on a strip or processing only good units in a singles format is solved by receiving only good single units from the PCB vendor or a manufacturer's own operations and then attaching (or having the vendor attach) only "good" accepted PCB units to a disposable or re-usable carrier strip that is compatible with all of the downstream BGA assembly processes. The PCB units are preferably formed on a relatively thin, approximately 0.2 to about 1.0 mm thick, epoxy-glass or polyimide glass semi-flexible substrate or BT-epoxy or other flexible circuit. The units are attached to the periphery of a series of spaced apertures in the carrier strip and firmly held in a position overlying a respective one of the carrier strip apertures.

An IC die(s) is attached to the PCB and appropriate wire bonding performed. The invention specifically allows for standard automolding of the BGA PCBs in the carrier strip. The carrier strip is configured so that the molding runner will sit normally on the top surface of the carrier strip. The BGA mold cavity of a single molding die, clamps on the top side of the carrier strip. Mold compound is transferred over the surface of the carrier strip into the mold cavity. The mold cavity sits inside the aperture in the carrier strip. The dimensions of the cavity are slightly larger (approximately 0.5 mm) than the resultant molded body dimensions and basically has the same peripheral shape as the desired molded body. A hardenably mold compound flows into the opening of the carrier strip onto each of the single unit PCB attached to the carrier strip forming the molded encapsulant body around the die, the die bonds and the metallization on the PCB's. After the mold compound hardens the molding die opens, and in a separate operation, the mold runner is removed from the carrier strip surface and molded package body in a de-gating operation. The mold runner is not well-adhered to the carrier strip.

The series of molded packages are transported through the rest of the packaging process while in the carrier strip. All other assembly processes such as post-mold curing, marking and solder bumping are accomplished while the molded package is still attached to the strip carrier. The final major operation in the BGA assembly process of the invention is singulation of the single units from the carrier strip. This can be accomplished in several novel manners. In one embodiment a v-cut edged, single unit PCB that had been originally attached to the carrier strip is manually detached from the carrier strip by exerting a downward force on the top of the molded package body while holding the two sides of the PCB which were attached to the carrier strip. This creates a force on the v-cut edge of the PCB which results in detachment of the fully assembled single unit BGA from the carrier strip. A portion of the PCB which had been attached to the carrier strip remains behind the carrier strip. Another method of singulating the individual finished BGA from the carrier strip is to use a saw. The saw is used to cut off the excess PCB material which has been attached to the carrier strip. After sawing through the PCB the finished BGA package is removed from the carrier strip. Still another method of removing the BGA from the carrier strip is to punch through the carrier strip and PCB at the same time. After punching the remaining carrier strip can be removed from the singulated BGA. If desired, the normal metallic (e.g. copper) carrier strip material can be permanently left on the BGA PCB to improve the thermal performance of the BGA. In this embodiment, a permanent peripheral bond between the PCB and the carrier strip is made at the time the PCB is attached to the carrier strip. Other methods such as a tape which loses its adhesion may be employed.

The method of making a grid array assembly including a printed circuit board containing multiple electrical circuits includes the step of providing a series of printed circuit boards including bonding pads and metallization on a first surface of each board and conductive vias in the board extending to a second opposite second surface of the board, the second surface containing an array of contact pads in contact with the vias, which boards have been tested and determined to be accepted boards. The ensuing steps include providing an elongated carrier strip having a series of aligned apertures extending longitudinally along the strip for mounting individual accepted boards; attaching an individual accepted board in each aperture; mounting an integrated circuit die including die conductive pads, on the first surface; bonding wire bonds from the die conductive pads to the board bonding pads; encapsulating the die and the wire bonds against a portion of the first surface of the boards; and then after any other finishing operations including forming interconnection ball bumps, removing a completed grid array assembly, including the printed circuit board and die assembly from the carrier strip.

An article of manufacture is disclosed comprising a series of pre-tested and pre-accepted printed circuit boards mounted in seriatim in apertures extending longitudinally along an elongated carrier strip, each of the circuit boards having an outer peripheral edge connected to an inner peripheral edge of the carrier strip bounding the apertures in the carrier strip, the carrier and the circuit boards being adapted for use in assembling the circuit boards into grid array packages each including an integrated circuit, wire bonds and an encapsulant.

DETAILED DESCRIPTION

According to the invention, a substrate-based packaged electronic device, such as a ball grid array including an IC die, is produced by an automolding process. A series of conforming (the same) generally planar printed circuit boards (PCB) are manufactured with suitable conductive traces (metallization), an IC die attach area(s) and bonding pads on one surface and an array of contact pads on an opposite surface with conductive vias extending from the metallization on the one surface to the contact pads on the opposite surface. In the past as described above, PCB's have been manufactured in strip form so that four, six, eight or more identical PCB's are formed in situ in strip format. In the present invention, following manufacturing either singly or on the normal plastic strip the PCB units are tested to ensure that each PCB meets a prescribed detailed performance specification. Any PCB not meeting the specification is rejected. Those PCB's meeting the specification, herein termed "accepted" boards, are singulated, if not already in a single form, and then attached to a disposable or reusable carrier strip generally in the form of a strong, semi-flexible web of copper or stainless or other steel or other material stock of from about 0.2 mm to about 1.0 mm in thickness. The carrier strip is compatible with all the subsequent ball grid array (BGA) manufacture and assembly steps. Each carrier strip has a series of spaced apertures over which a single PCB is attached. The invention specifically allows for standard automolding of each PCE in the carrier strip.

Figure 1:
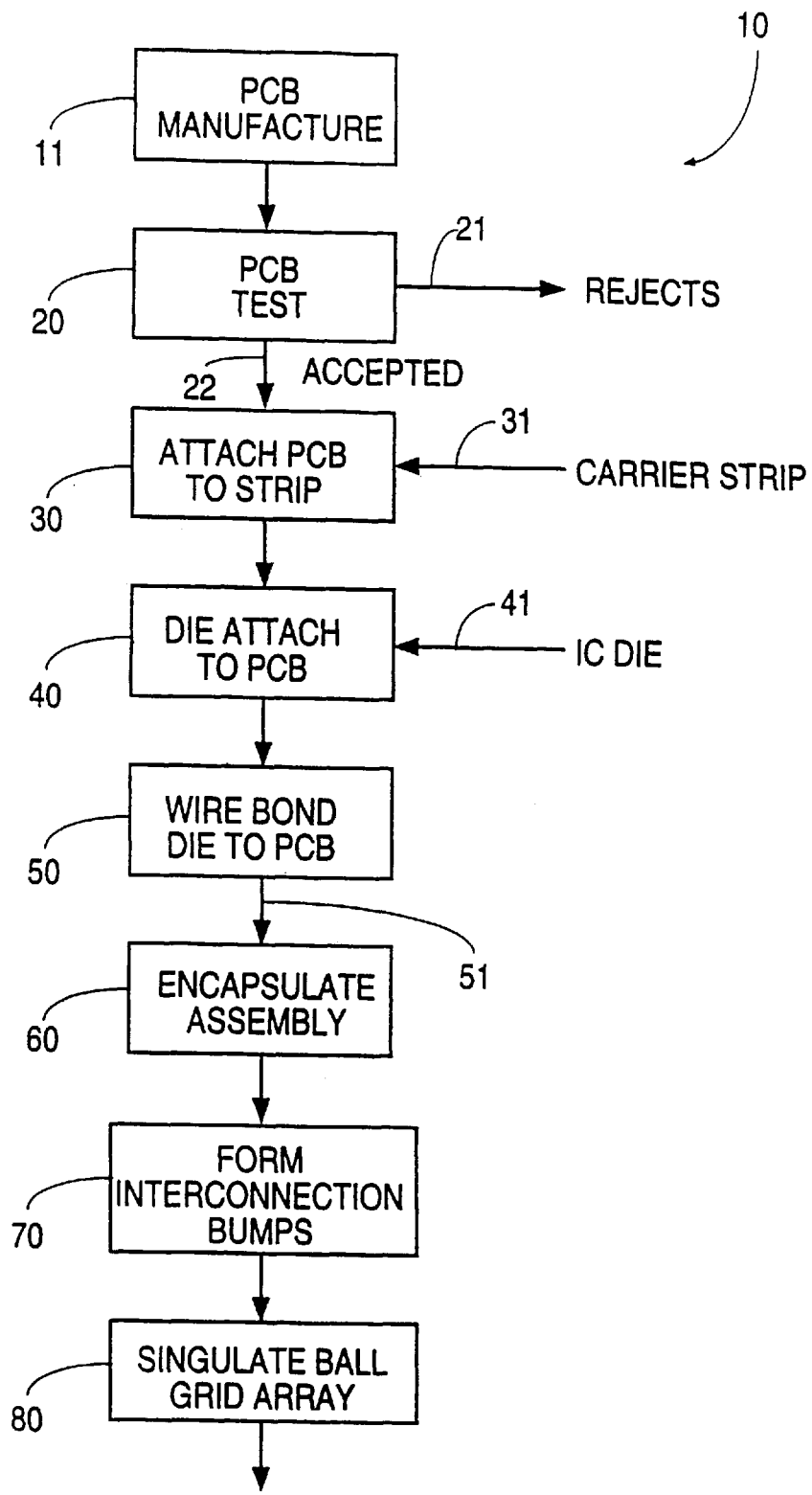
FIG. 1 is a block flow diagram of the method according to an embodiment of the invention for forming a grid array assembly.

FIG. 1 is a diagram of a process 10 according to an embodiment of the invention for forming a ball grid array.

In step 11 the PCB is manufactured with prescribed metallization including patterned conductive traces of copper or the like, die attach areas, conductive bonding pads, conductive vias extending from metallization on one PCB surface to an opposite surface forming through board interconnections with an array of contact pads on that opposite surface.

In step 20 each PCB is tested to the prescribed performance specification and those PCB not meeting the specification become rejects 21. Those PCB's meeting the specification are accepted boards 22.

Figure 2:
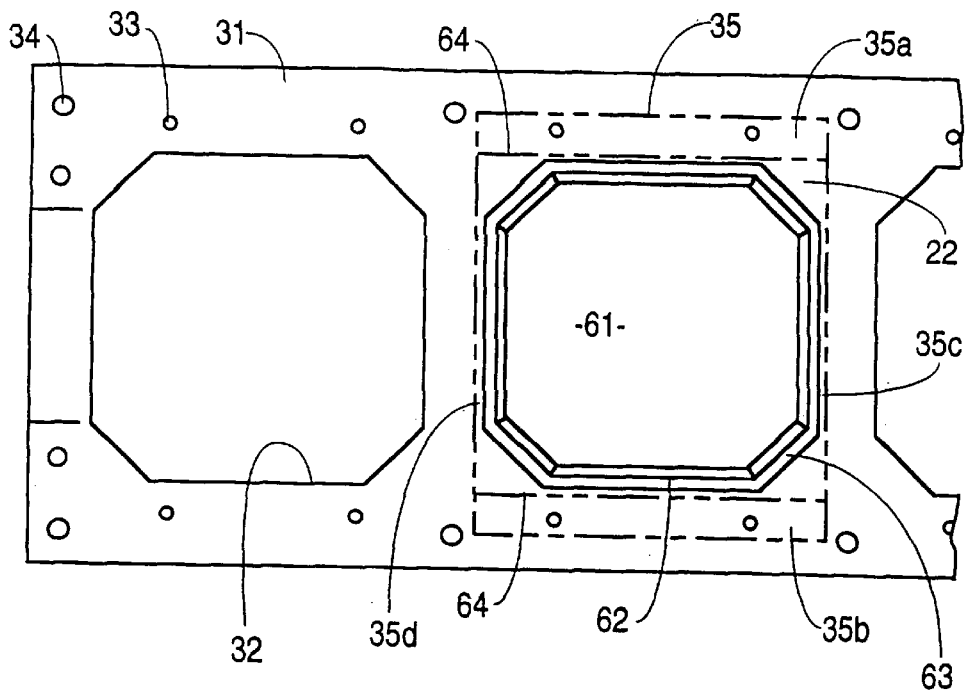
FIG. 2 is a plan view of a carrier strip showing on the right side a molded grid array package therein.

In step 30 a prescribed number of the accepted boards are attached to an incoming carrier strip 31 by automatic assembly apparatus (not shown) which attaches, by adhesive bonding, welding, riveting, soldering or the like, marginal outer peripheral edges of each PCB to edge margins of a carrier strip aperture, as described herein with respect to FIG. 2. A PCB with no marginal outer peripheral edges which is attachable to the carrier strip by adhesive bonding in the carrier strip aperture may also be used. In this embodiment, the area dimension of the accepted boards is the same as the area dimension, e.g. 27 mm×27 mm, as the singulated assembly described below.

In step 40 incoming semiconductor IC dies 41 are attached to each accepted PCB in a PCB die attach area using conventional materials such as epoxy or acrylic or polyimide adhesive, and by conventional processes.

In step 50 the mounted die 41 is wire bonded or otherwise connected to bonding pads on the PCB to form an assembly 51.

In step 60, the assembly 51 particularly the die and wire bonds are encapsulated to enclose the die and any other electronic device and at least a peripheral portion of the PCB encircling the die attach area, as explained in detail below. Briefly a mold die, having a cavity shaped generally to conform to the to-be-molded shape of the final BGA package, is positioned against peripheral edges of the carrier strip aperture and encapsulant transferred into the mold cavity and through a mold runner area on the carrier strip until the cavity is filled.

The encapsulant flows around die 41 and the wire bonds and adheres to interior portions of the PCB including metallization surrounding the die attach area. When the encapsulant hardens the mold die is removed or opened. Excess encapsulant (bleed) is formed on the surface of the carrier strip and poorly adheres thereto. It is easily removed in a later step by exerting a torqueing or tensile force on the mold runner attached to the strip carrier. This allows excess encapsulant to peel cleanly from the carrier and the package encapsulant without pulling any of the package encapsulant away from the PCB nor twisting the PCE so as to damage the resultant packaged electronic device, either cosmetically, mechanically or electrically.

In step 70 interconnection bumps, generally in a solder ball configuration, are formed.

In step 80 each so-formed ball grid array is singulated from the carrier strip.

Figure 6:
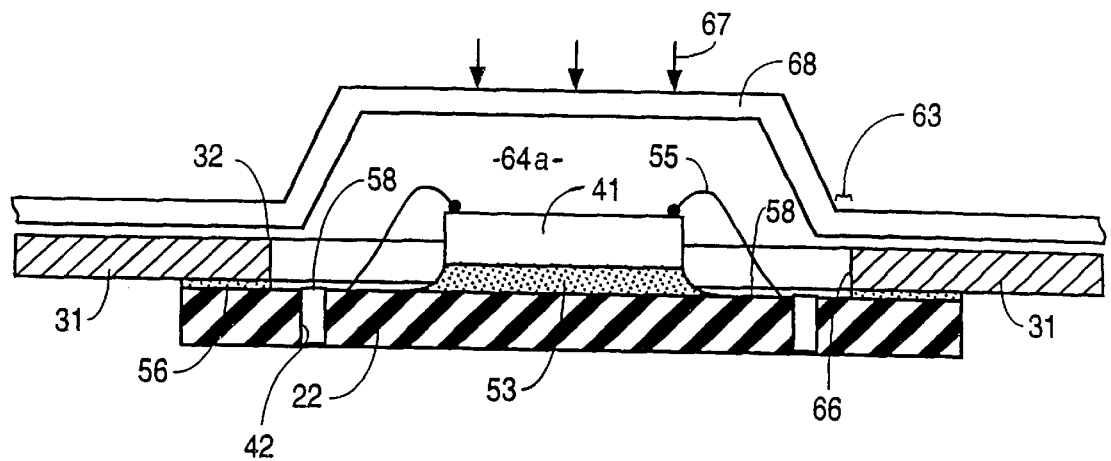
FIG. 6 is a schematic side view partially in cross-section showing the start of automolding operation of encapsulating a mounted die and wire bonds.

FIG. 2 is a plan view of a portion of a carrier strip 31 showing on the left side an octagonal carrier strip aperture 32 under which a PCB is to be mounted. The preferably copper carrier strip includes tooling holes 33 and 34 which, respectively, are used to align a PCB 22 against the strip in aperture overlying position and to position the carrier strip on and with respect to the various apparatus of standard manufacturing equipment e.g. the mold or wire bonder, used in the production of a packaged electronic device such as a BGA, in accord with this invention. As seen on the right side of FIG. 2 an accepted PCB 22 having in one embodiment a 27 mm by 29 mm rectangular size denoted by dashed outline lines 35 is positioned so as to underlie aperture 32 with the long ends 35*a* and 35*b* of the PCB 22 extending beyond holes 33. The short ends overlap the side marginal edges 35*c* and 35*d* of the carrier strip aperture 32 by only about 0.5 mm to about 0.8 mm. The PCB is attached to the carrier strip at those four overlaps, or at long end overlaps 35*a* and 35*b* only, by suitable adhesive 56 (FIG. 6). The adhesive may be a double-sided adhesive tape suitable for the processing environment to which it will be subjected, such as Lead Lock tape from Brady Co. of Milwaukee, Wis. or comparable tape from Tomoegawa of Japan or Pyralux™ adhesive tape from DuPont Co. After encapsulation to form a molded body 61, a bevelled encapsulant edge 62 is formed encircling the body 61 inside a mold shut off area 63. Typical bleed or mold flash 61*b* is shown extending on the top surface of the carrier strip 31. Flash 61*a* may extend anywhere on this surface. Upon singulation of the BGA from the carrier strip in step 80 the finished/completed BGA package will have a 27 mm. by 27 mm. size with or without an attached portion of the carrier strip, as seen by the multi-dashed lines 64.

Figure 3:
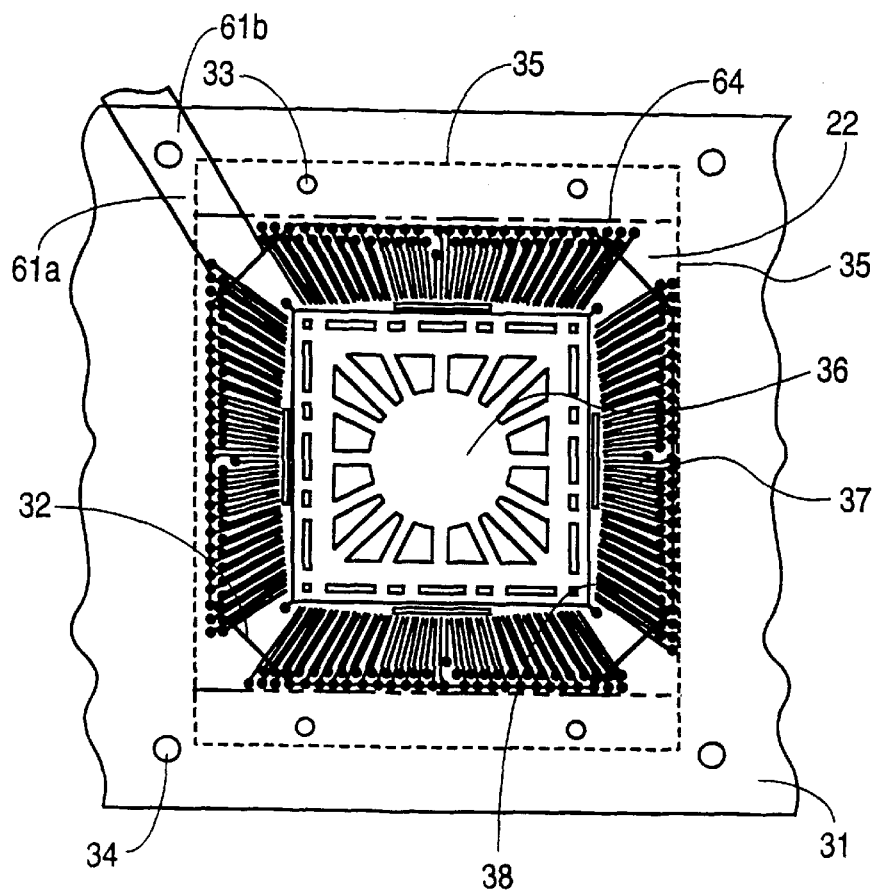
FIG. 3 is a plan view of a carrier strip section showing an obverse side of a mounted printed circuit board prior to die mounting, wire bonding and encapsulation.

FIG. 3 illustrates the mounting of a PCB 22 overlying an aperture 32 of a series of apertures in the carrier strip 31. A die attach area 36 is provided for mounting the IC die or electronic device. Metallization traces 37 including gold-plated or other electrically conductive bonding pads 38 extend over the top surface of the PCB 22 to vias through one or more board levels. The standard PCB substrate may be, for example, epoxy-glass or polyimide-glass or BT/epoxy (bismaleimide-triazine and epoxy). If multilayer PCB's are used electrically conductive traces or regions (e.g. ground planes or power planes) can be formed by conventional photoresist and masking processes, within the multi-layer substrate and connected to the exterior opposite surface with conductively plated vias or through holes formed by well-known techniques including mechanical or laser drilling and followed by electroless or electro plating. Annular conductive rings may be provided at the end of the vias and connected to the adjacent areas containing the contact or solder pads on which the interconnection bumps will be formed. The strip 31 further functions as a mold gate at area 61*b* and due to the ease of removal of any flash 61*a* leaves a clean package outline when the mold halves 68 and 69 (FIG. 5) are separated.

Figure 4:
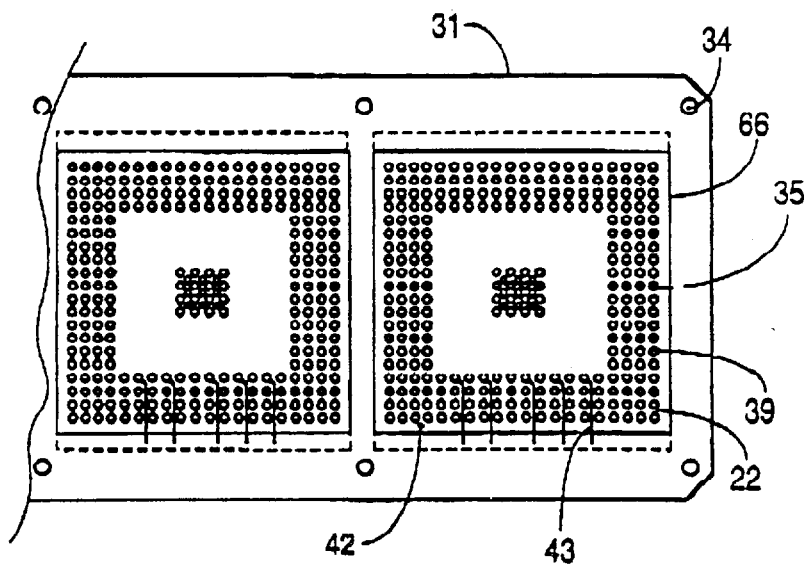
FIG. 4 is a plan view of a strip section showing a reverse side of two printed circuit boards prior to forming ball bonds on an array of contact pads.

FIG. 4 shows the reverse or underside of the attached accepted board 22 where the edges 27 mm. by 29mm of the PCB are seen by lines 35. Vias 42 interconnect metallization 37 (FIG. 3) and contact pads 39. Interconnect balls or bumps 71 (FIG. 7) are later formed on contact pads 39. Parallel conductive traces 43 extend from certain bump pads to facilitate electroplating.

Figure 5:
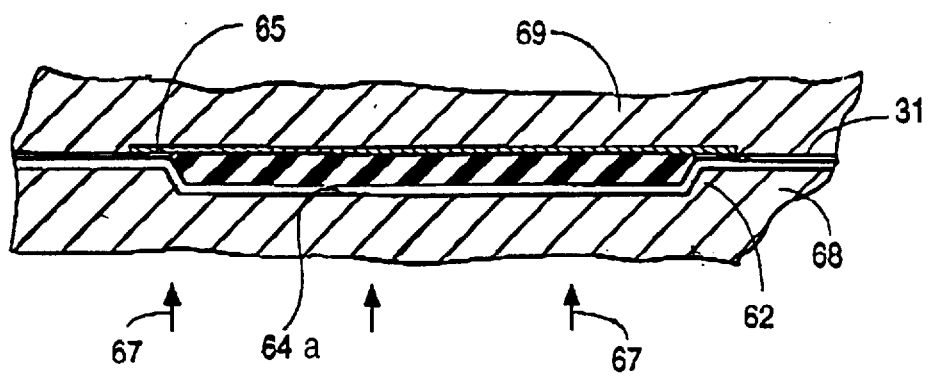
FIG. 5 is a schematic side partial view of a molding die and cavity for encapsulating the grid array die and wire bonds.

FIG. 5 illustrates the automolding of a package body 61 by the action of a molding die 68 having a cavity 64a which clamps against and around the periphery of the boundary surface edges 65 of the carrier strip apertures. The inner peripheral edges 66 (FIG. 6) of the strip aperture act as a stop or dam for the encapsulant with the strip aperture edges 65 acting as a mechanical shut-off for the liquid molding compound e.g. Plaskon molding compound, being dispensed into the molding die cavity. Arrows 67 indicate clamping of the mold die against the carrier strip 31 which is backed by a fixed mold die-supporting surface 69 during the clamping and encapsulating operations. When encapsulant is supplied into the cavity (with the top side of the PCB facing downwardly as shown in FIG. 4) a mold body 61 with or without a bevelled side edge 62 is formed upon hardening of the mold compound. A mold runner 61a (FIG. 3) extends from a mold supply inlet (not shown) to the mold cavity. For illustration purposes a non-existent gap is seen between the die 68 and the molded body 61. By molding against the carrier strip aperture edges poor adhesion of the molding compound results and the compound does not tenaciously stick to PCB surfaces, other than at portions within the mold body surrounding the die attach area.

FIG. 6 shows the portion of the mold die 68 immediately before completion of clamping against the carrier strip 31. When clamping is completed against the carrier strip 31, encapsulant is injected into cavity 64 to encapsulate die 41, wire bonds 55, the outer edges of the attach adhesive 53 and an annular portion 58 of the PCB 22. Flash is prevented or minimized by the clamping force of the molding die against the carrier strip.

Figure 7:
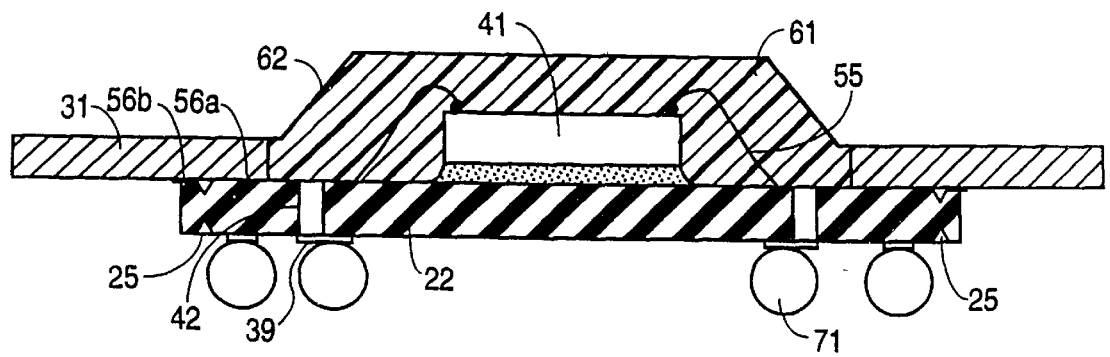
FIG. 7 is a schematic side view partially in cross-section showing the encapsulated die and wire bonds.

FIG. 7 illustrates the final packaged assembly resultant from step 70 namely, the forming of interconnecting bumps, e.g. solder balls 71, on the contact pads 39 in electrical connection to vias 42 and to the metallization 37 on and the die 41 mounted to the PCB. V-cut edge 25 which aids in the singulation step 80 may be included around the edge periphery of PCB 22. The substrate is not adhesively bonded to the carrier strip in the area 56a inside of the V-cut and is bonded only in area 56b at an interface with the carrier strip outside of the V-cut, to facilitate the singulation of each BGA from the carrier strip.

In the singulation step 80 the finished BGA is broken out by pushing on the package to break it out of the carrier strip along the V-cut or by punching or sawing off 1.0 mm of the long sides of the original 27 ×29 mm PCB to result in a 27×27 mm packaged device.

An annular ring of copper from around the carrier strip aperture may be removed or left on to function as a heat sink and package stiffener to reduce package warpage. The carrier strip may be reused if no permanent damage results from excising the assembly from the carrier strip.

The above description of embodiments of this invention is intended to be illustrative and not limiting. Other embodiments of this invention will be obvious to those skilled in the art in view of the above disclosure.

We claim:

1. A method of making a grid array assembly including a printed circuit board containing multiple electrical circuits comprising:

providing a series of boards including bonding pads and metallization on a first surface of each board and conductive vias in the board extending to a second opposite second surface of the board, said second surface containing an array of contact pads in contact with the vias, which boards have been tested and determined to be accepted boards;

providing an elongated carrier strip having a series of aligned apertures extending longitudinally along the strip for mounting individual accepted boards, wherein the strip is a copper or steel strip having a thickness of from about 0.2 mm to about 1.0 mm;

attaching an individual accepted board in each aperture;

mounting an integrated circuit die including die conductive pads, on said first surface;

bonding wire bonds from said die conductive pads to said bonding pads;

encapsulating said die and said wire bonds against a portion of said first surface of the boards; and removing a resultant grid array assembly, including the printed circuit board and encapsulated die from the carrier strip.

2. The method of claim 1 in which said attaching comprises bonding side edges of the accepted boards in seriatim in each of said aligned apertures.

3. The method of claim 2 wherein said encapsulating includes providing a molding die including a molding cavity and a molding runner;

closing and clamping the molding die including the molding cavity and molding runner on a peripheral surface of the carrier strip overlying said board portion;

transferring a hardenable molding compound into the molding cavity, around said die and said wire bonds and onto said board portion;

hardening the molding compound; and unclamping and opening said molding die to remove the molding runner from the strip carrier.

4. The method of claim 3 wherein the area dimension of the accepted boards is the same as the area dimension of the singulated assemblies.

5. The method of claim 1 wherein said grid array assembly is a ball grid array assembly.

6. A method of making a grid array assembly including a printed circuit board containing multiple electrical circuits comprising:

providing a series of boards including bonding pads and metallization on a first surface of each board and conductive vias in the board extending to a second opposite second surface of the board, said second surface containing an array of contact pads in contact with the vias, which boards have been tested and determined to be accepted boards;

providing an elongated carrier strip having a series of aligned apertures extending longitudinally along the strip for mounting individual accepted boards;

attaching an individual accepted board in each aperture;

mounting an integrated circuit die including die conductive pads, on said first surface;

bonding wire bonds from said die conductive pads to said bonding pads;

encapsulating said die and said wire bonds against a portion of said first surface of the boards;

removing a resultant grid array assembly, including the printed circuit board and encapsulated die from the carrier strip;

in which the attaching comprises bonding side edges of the accepted boards in seriatim in each of said aligned apertures;

wherein said encapsulating comprises providing a molding die including a molding cavity and a molding runner;

closing and clamping the molding die including the molding cavity and molding runner on a peripheral surface of the carrier strip overlying said board portion;

transferring a hardenable molding compound into the molding cavity, around said die and said wire bonds and onto said board portion;

hardening the molding compound;

unclamping and opening said molding die to remove the molding runner from the strip carrier; and in which said removing comprises singulating single grid array assemblies from the carrier strip.

7. The method of claim 6 wherein after the encapsulating and before removing, forming interconnecting bumps on said array of contact pads.

8. The method of claim 6 wherein the singulating comprises providing a V-cut edge on each accepted board, bonding the accepted board only at an interface of the accepted board and carrier strip peripherally outside of the V-cut edge and detaching the accepted board from the carrier strip.

9. The method of claim 6 wherein the singulating comprises punching through an outer periphery of the accepted board and an inner periphery of said carrier strip around the strip apertures.

10. The method of claim 6 wherein the singulating comprises sawing off an excess peripheral margin of the accepted board which has been attached to the carrier strip.

11. The method of claim 6 wherein including leaving a sufficient amount of a portion of the carrier strip on a singulated assembly such that the strip portion rejects heat from an operating assembly and stiffens the assembly.

12. A method of making a grid array assembly including a printed circuit board containing multiple electrical circuits comprising:

providing a series of boards including bonding pads and metallization on a first surface of each board and conductive vias in the board extending to a second opposite second surface of the board, said second surface containing an array of contact pads in contact with the vias, which boards have been tested and determined to be accepted boards;

providing an elongated carrier strip having a series of aligned apertures extending longitudinally along the strip for mounting individual accepted boards;

attaching an individual accepted board in each aperture:

mounting an integrated circuit die including die conductive pads, on said first surface;

bonding wire bonds from said die conductive pads to said bonding pads;

encapsulating said die and said wire bonds against a portion of said first surface of the boards;

removing a resultant grid array assembly, including the printed circuit board and encapsulated die from the carrier strip; and further comprising providing an accepted board having a dimension on spaced opposite sides which is longer than one X-Y dimension of a finished grid array package and wherein the resultant areas attach the accepted board to the carrier strip.

* * * * *